United States Patent [19]

Eggenberger et al.

[11] 4,115,768
[45] Sep. 19, 1978

[54] SEQUENTIAL ENCODING AND DECODING OF VARIABLE WORD LENGTH, FIXED RATE DATA CODES

[75] Inventors: John S. Eggenberger, Los Altos; Paul Hodges, San Jose, both of Calif.

[73] Assignee: International Business Machines Corporation, Armonk, N.Y.

[21] Appl. No.: 807,999

[22] Filed: Jun. 20, 1977

Related U.S. Application Data

[63] Continuation of Ser. No. 466,360, May 2, 1974, abandoned.

[51] Int. Cl.² .......................................... H03K 13/24
[52] U.S. Cl. ............................................ 340/347 DD
[58] Field of Search ............. 340/347 DD, 146.1 AB, 340/146.1 D; 235/154; 360/39, 40

[56] References Cited

U.S. PATENT DOCUMENTS

| | | | |
|---|---|---|---|
| 2,973,511 | 2/1961 | McLaughlin | 340/347 |
| 3,016,527 | 1/1962 | Gilbert et al. | 340/347 DD |
| 3,172,097 | 3/1965 | Imlay | 340/347 |
| 3,274,378 | 9/1966 | Crawford et al. | 235/154 |
| 3,691,554 | 9/1972 | Marschall | 340/347 DD |
| 3,810,111 | 5/1974 | Patel | 340/347 DD |
| 3,921,143 | 11/1975 | Woodrum | 340/347 DD |
| 4,032,979 | 6/1977 | Rice | 360/40 |

FOREIGN PATENT DOCUMENTS 1,067,418   5/1967   United Kingdom.

*Primary Examiner*—Thomas J. Sloyan
*Attorney, Agent, or Firm*—Richard E. Cummins

[57] ABSTRACT

Apparatus for converting binary digital data from one form to another according to a variable word length code of fixed rate comprises word position indicating circuitry for indicating predetermined word position states of data in a data storage unit and conversion circuitry for sequentially converting a constant number of input bits at a time into the corresponding number of bits in said other form in dependence upon the contents of the data storage unit and the word position indication. The constant number of bits is less than the number of bits in the longest variable length word in the input data code form. The word position indicating circuitry either generates an updated function representing the current position of the word boundary in the data storage unit or recognizes the boundary from distinctive word ending patterns in the data storage unit.

14 Claims, 9 Drawing Figures

| DATA WORDS | CODE WORDS |
|---|---|
| 1 0 | 0 1 0 0 |
| 0 1 0 | 1 0 0 1 0 0 |
| 0 0 1 0 | 0 0 1 0 0 1 0 0 |
| 1 1 | 1 0 0 0 |
| 0 1 1 | 0 0 1 0 0 0 |
| 0 0 1 1 | 0 0 0 0 1 0 0 0 |
| 0 0 0 | 0 0 0 1 0 0 |
FIG. 1
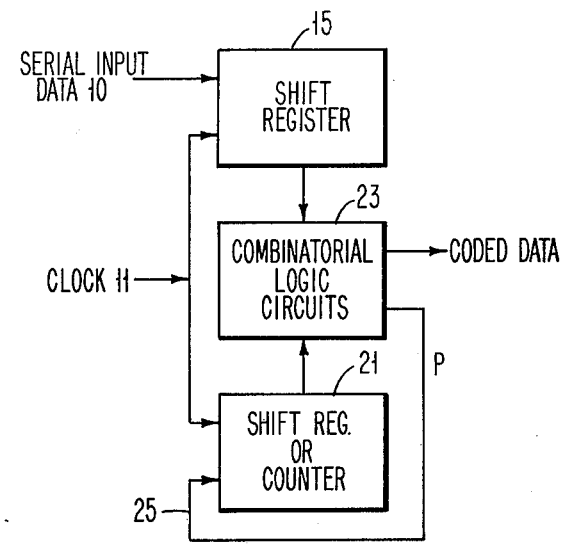
FIG. 2
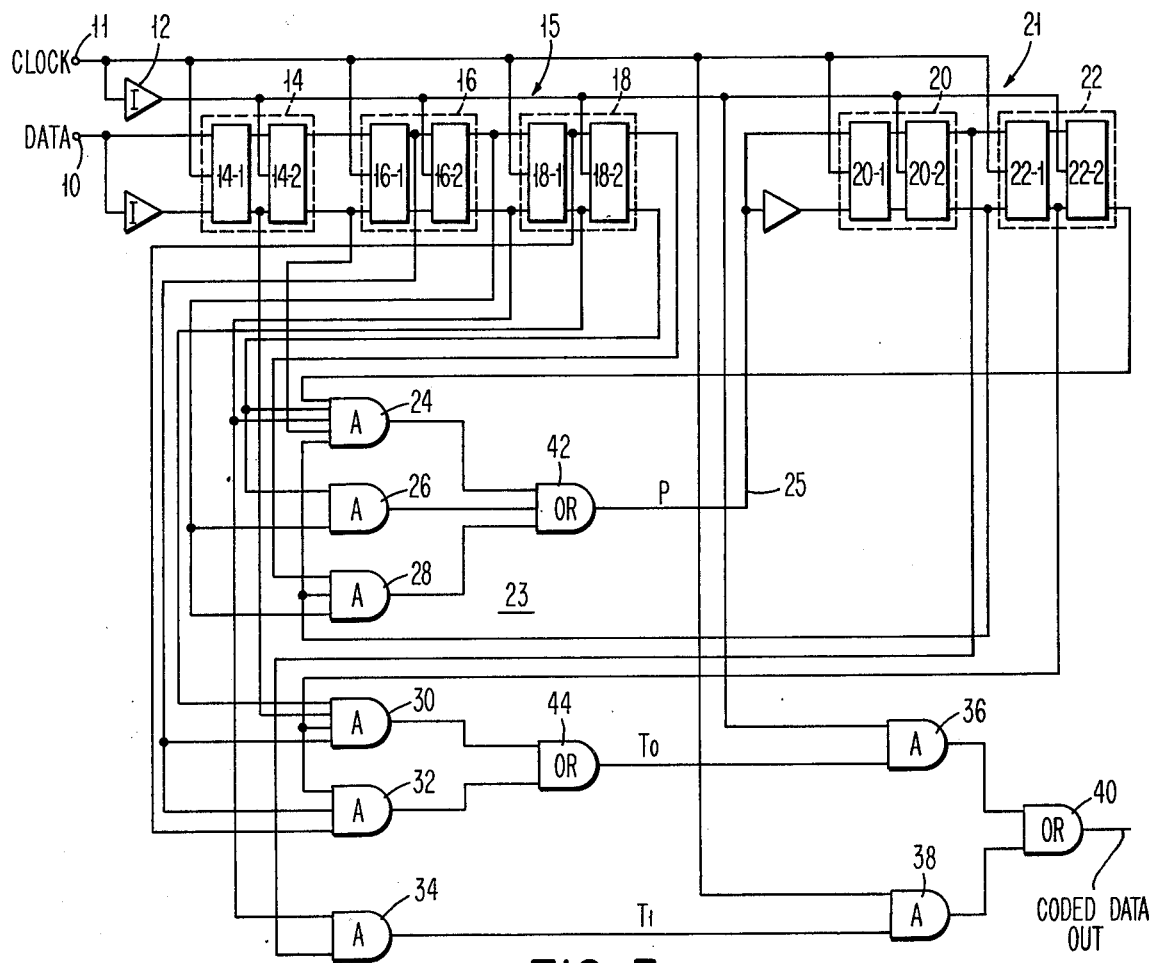
FIG. 3

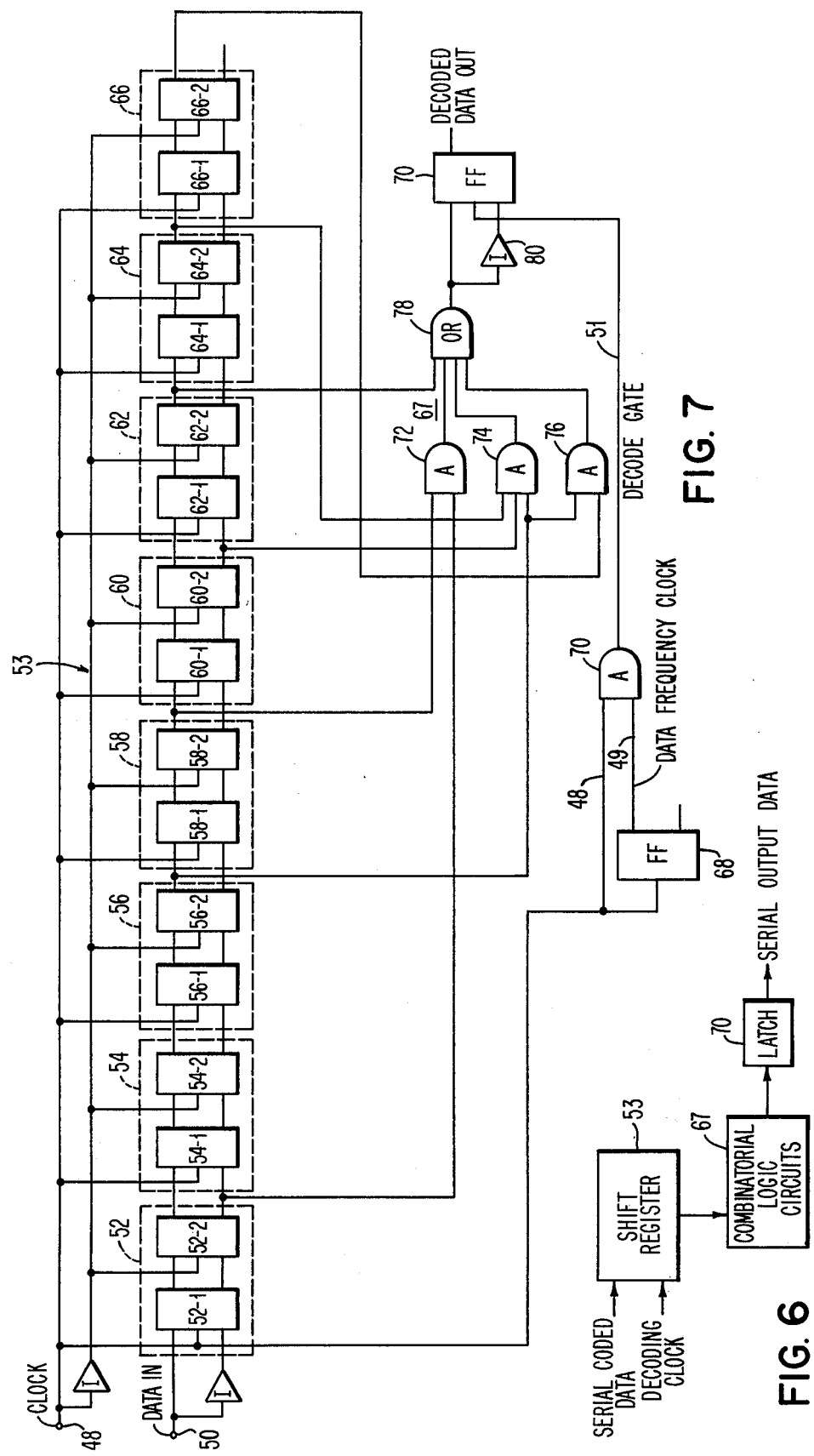

SEQUENTIAL ENCODING AND DECODING OF VARIABLE WORD LENGTH, FIXED RATE DATA CODES

This is a continuation of application Ser. No. 466,360 filed May 2, 1974, now abandoned.

REFERENCE TO RELATED PATENT

U.S. Pat. No. 3,689,899 issued to P. A. Franaszek and assigned to the same assignee, teaches a class of codes having desirable density and run length properties. With the codes described therein, the length of the word to be encoded or decoded varies for different data patterns. For each successive word in a sequence, a decision must be made as to the number of bits in the word, the word must be framed, and the appropriate number of bits must be encoded or decoded.

BACKGROUND OF THE INVENTION

1. Field of the Invention

This invention relates to novel method and apparatus for encoding and decoding data.

2. Description of Prior Art

It is known that run length limited codes employing variable length words are more efficient than those using fixed length words. However, in prior art systems variable length words generally require framing at proper places to demarcate respective code words. In one known system, special marker bits are used at the beginning of each word in conjunction with a table lookup procedure. This arrangement is relatively slow and costly. Also, when word framing is used, faulty bit detection tends to propagate a framing error for succeeding bit groups. In such case, a statistical probability approach is employed, but this approach has problems of regaining synchronization and also of operating within the run length limited constraints.

It would be advantageous to use a run length limited variable length coding technique in which framing decisions are not required and translation of input data may be accomplished with incomplete words.

Definitions

The codes addressed herein are defined by specifying a set of allowable sequences of coded bits (code words), each code word corresponding to a unique sequence of data bits (a data word).

A code is described as fixed-rate if for every corresponding pair, consisting of a data word of length $m$ bits and code word of length $n$ bits, the ratio of $m$ to $n$ is the same.

A code is described as having fixed length words if the lengths of all code words are the same, and variable length words otherwise. In variable word length codes, only a predetermined plurality of bit patterns of differing lengths are valid code words.

Encoding is the process of operating on a sequence of one or more data words so as to produce the corresponding sequence of code words. Decoding is the inverse process, i.e., that of operating on a sequence of one or more code words so as to produce the corresponding sequence of data words.

SUMMARY OF THE INVENTION

An object of the invention is to provide an encoding and decoding scheme employing variable word-length, fixed-rate data codes that does not require framing of entire words during the encoding or decoding process.

Another object of this invention is to provide a run-length-limited variable-word-length data code in which the data is encoded and decoded bit-by-bit instead of on a word-by-word basis, therefore requiring relatively simpler logic.

Accordingly, the present invention provides apparatus for encoding binary digital data in a variable word length fixed rate code and apparatus for decoding such coded data. Conversion is effected on a regular sequential basis, a constant number of bits at a time notwithstanding the variable word lengths involved. The constant number of bits is preferably a minimum and in any case is less than the number of bits in the longest variable length word being converted. The data to be converted is passed serially through a storage means, preferably a shift register.

When decoding from the variable word length code, various word boundary states in the storage means are recognized from the limited number of permissible bit patterns in the code. When encoding, word boundary positions are stored in an auxiliary store, such as a shift register or a counter, which is updated in step with the passage of data through the data storage means. Knowledge of word boundary positions is necessary to resolve certain ambiguous coding and decoding situations.

In a specific embodiment of encoding, a first three-bit shift register and a second two-bit shift register or counter are employed, the second shift register or counter changing its state according to the data pattern. The bits that are stored in the first shift register are encoded on a bit-by-bit basis, and processing of the data is not dependent on a variable number of bits that are shifted into the first register.

The stored information in the encoder is (a) the values of the three most recent bits of the series of input bits; and (b) the position of the boundary between words, if the three stored input bits belong to more than one word.

A specific embodiment of decoding corresponding to the above encoder consists of an eight-bit shift register and combinational logic by means of which data is decoded on a bit-by-bit basis from the contents of the shift register.

BRIEF DESCRIPTION OF THE DRAWING

The invention will be described in greater detail with reference to the drawing in which:

FIG. 1 is a code table showing correspondence between code words and data patterns for a run-length-limited code of variable word length in which the coded sequences have minimum and maximum runs of zeros between ones of length two and seven, respectively;

FIG. 2 is a schematic representation of a sequential encoder used for generating a variable-word-length code, in accordance with this invention;

FIG. 3 is a logic diagram illustrating an embodiment of the sequential encoder of FIG. 2 for the code described in FIG. 1;

FIG. 6 is a schematic representation of a sequential decoder used for detecting the code generated by the sequential encoder of FIG. 2;

FIG. 7 is a logic diagram of an embodiment of the sequential decoder of FIG. 5 for the code described in FIG. 1;

Similar numerals refer to similar elements throughout the drawing.

DESCRIPTION OF THE PREFERRED EMBODIMENT

Figure 4:
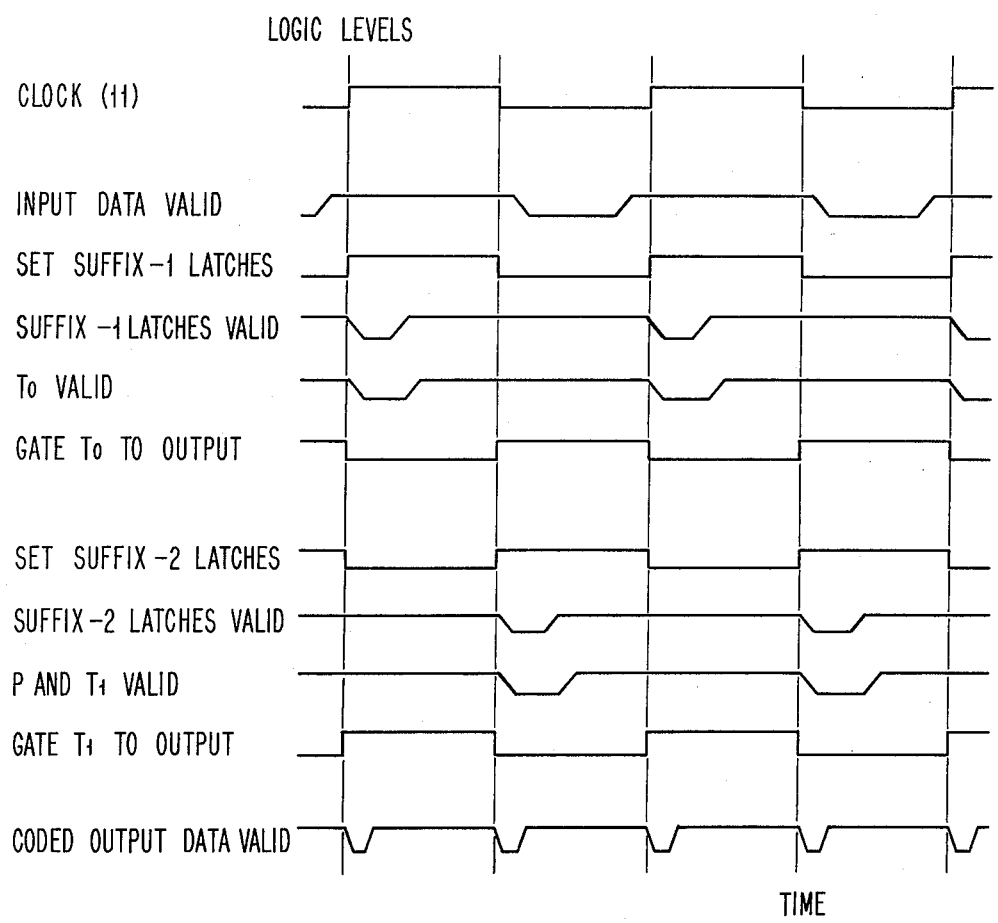
FIG. 4 is a timing chart showing the relationship between various signals in the encoder.

FIG. 1 sets forth a run-length-limited (2,7) code with variable word length of the type generally described in the related U.S. Pat. No. 3,689,899 cited above. In this code, each code word consists of twice as many bits as the corresponding data word. While the code is a variable word length code, it is a constant rate code in that two coded bits correspond to each data bit.

With reference to FIGS. 2 and 3, a sequential encoder that is used for encoding data in variable length words according to the code described in FIG. 1 comprises a first shift register 15 that includes storage circuits 14, 16, and 18, a second shift register 21 that includes storage circuits 20 and 22 for storing auxiliary state variables, and logic circuits 23 which contain no storage elements.

In FIGS. 2 and 3, the variable $p$ is a "1" when the bit stored in storage circuit 14 is the last bit of a word. Thus, a "1" is stored in storage circuit 20 when storage circuit 16 contains the last bit of a word, and a "1" is stored in storage circuit 22 when storage circuit 18 contains the last bit of a word.

In FIG. 3, each storage circuit is shown as having two flip-flops, (−1) and (−2), respectively. For encoding, a clock signal (generation not shown) is used which runs at the rate of one cycle for each data bit to be encoded. During successive clock cycles, serial binary data derived from a memory store (not shown) are applied to lead 10 at the input of shift register 15. During each positive clock phase, the value of the input data bit on lead 10 is transferred to the first latch 14-1. If the binary data is a "one", for example, the latch is set and stores that information. The timing of the encoding operation of the circuit of FIG. 3 is illustrated in FIG. 4.

Simultaneously with the entering of a data bit into latch 14-1, the contents of latches 14-2 and 16-2 are transferred to latches 16-1 and 18-1, respectively. During the negative clock phase, the data bit values stored in the latches with suffix 1 are set into the corresponding latches with suffix 2, thus completing the shift cycle.

The operation of shift register 21 is similar, except that the input to the first latch 20-1 is the variable p, derived from the contents of shift registers 15 and 21. A combinatorial logic circuit 23 senses the arrangement of binary data and determines whether signal $p$ at the output line 25 will be high or low. The signal $p$ will be high if (1) all storage circuits 14 through 22 are in the zero or low state; or (2) storage circuit 18 is at zero and storage circuit 16 stores a binary one; or (3) if storage circuits 16 and 18 register a binary one and storage circuit 20 is a zero. If any of these three conditions exist, then $p$ will be high, and will cause a binary one to be set in latch 20-1 during the positive clock phase. Expressed logically, $p$ = $a\,b\,c\,q\,r + a\,b + a\,b\,r$ where $c$, $b$, $a$, $r$ and $q$ correspond to the outputs of latches 14, 16, 18, 20 and 22 respectively. With reference to FIG. 3, $p$ is generated by AND circuits 24, 26, and 28, and OR circuit 42. The inputs to 24, 26, and 28 are taken from the suffix-2 latches of shift registers 15 and 21, which are unchanged during the positive clock phase.

The presence of a binary one in latch 20 indicates that a word boundary exists between latches 14 and 16 of register 15. The presence of a binary one in latch 22 indicates that a word boundary exists between latches 16 and 18 of register 15.

The variables $t_o$ and $t_l$ represent the values of encoded data bits, $t_o$ being gated to the coded output sequence during the negative clock phase by AND circuit 36 and OR circuit 40, and $t_l$ being gated to the coded output sequence during the positive clock phase by AND circuit 38 and OR circuit 40. The variable $t_o$ is generated by AND circuits 30 and 32 and OR circuit 44. The inputs to 30 and 32 are taken from the suffix-1 latches of shift registers 15 and 21, which are unchanged during the negative clock phase. The variable $t_l$ is generated by AND circuit 34. The inputs to 34 are taken from the suffix-2 latches of shift registers 15 and 21, which are unchanged during the positive clock phase. Using the same notation as above, : $t_o = a\,b\,c\,q + a\,b\,q$ and $t_l = b\,r$.

Figure 5:
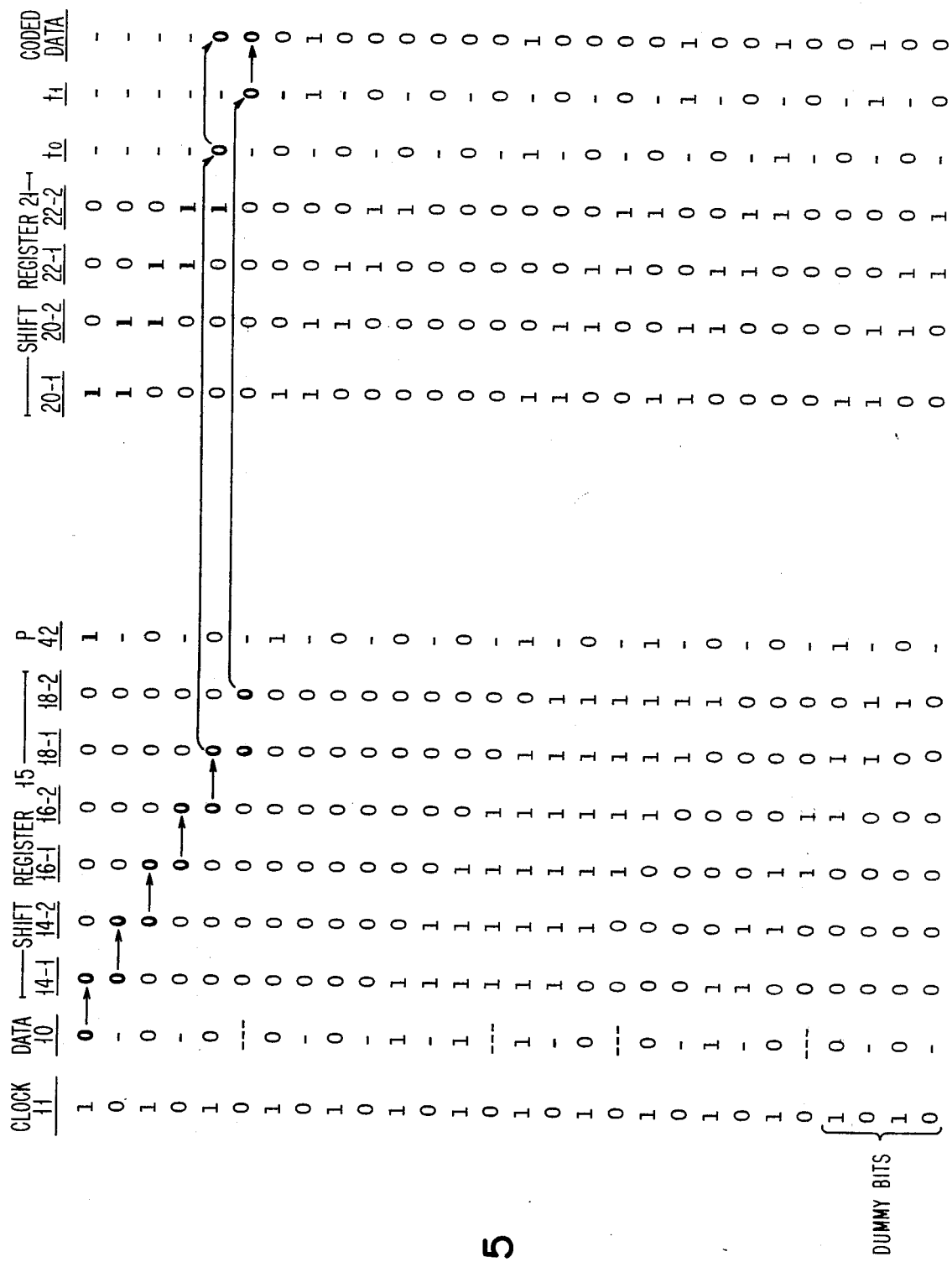
FIG. 5 is a tabular illustration of an example of the encoding of a data pattern by the sequential encoder of FIG. 3 in accordance with this invention.

FIG. 5 illustrates an encoding example employing the code of FIG. 1. Two bits are encoded for each input bit. The outputs $t_o$ and $t_l$ (see FIGS. 2 and 3) are respectively, the first and second encoded bits corresponding to the particular input data bit contained in storage circuit 18. The arrows from left to right show the progression of the first bit of data (emphasized) from input to generation of the corresponding pair of encoded bits. The dashed lines show the division between words in both input and encoded data sequences.

The encoding sequence is as follows: Initially, all latches of shift registers 15 and 21 are reset to the zero state (resetting logic not shown) in order to synchronize the variable $p$ correctly with the word boundaries of the input data. Serial data is entered into shift register 15 in synchronism with the clock. For the first two clock periods of a sequence, the coded data outputs, $t_o$ and $t_l$, are ignored. After the first three data bits have been entered into shift register 15, the coded data outputs are used to generate the encoded data stream, two coded bits being generated for each input data bit. Following the entry of the last data bit of the sequence, two "dummy" bits are entered to complete the encoding process. Thus, it can be seen that input data on line 10 is encoded in a regular sequence, one bit at a time, by the apparatus of FIG. 3. Each bit is encoded after a two bit delay after it is shifted into latch 18.

Figure 8:
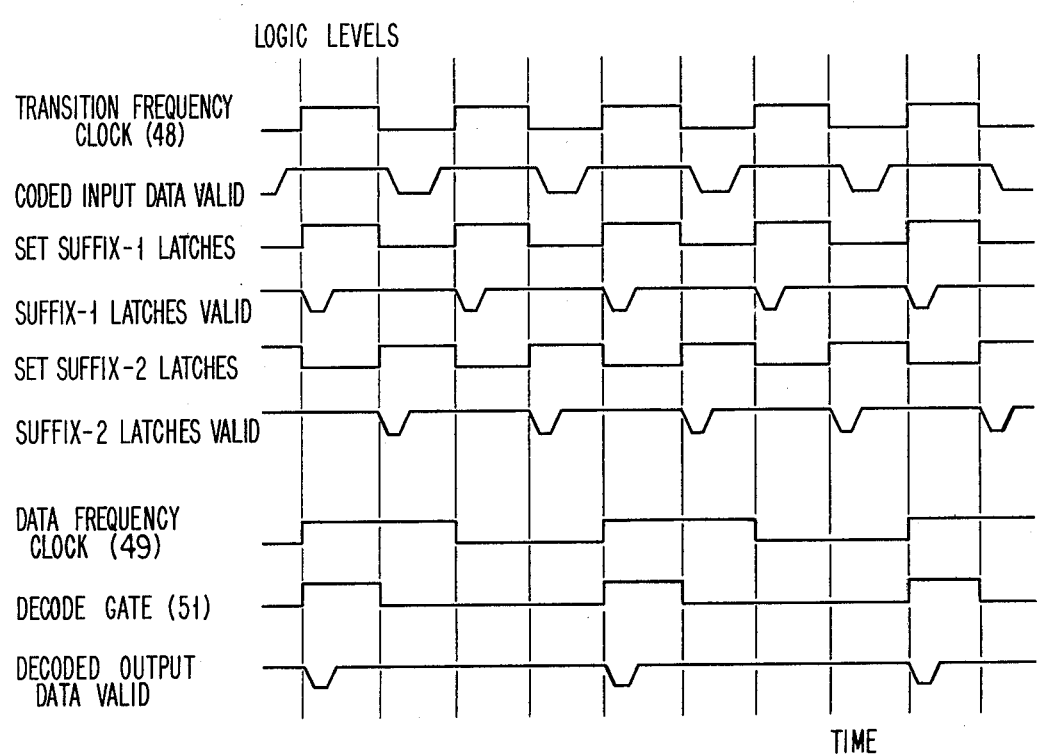
FIG. 8 is a timing chart showing the relationships between various signals in the decoder.

With reference to FIGS. 6, 7 and the timing diagrams of FIG. 8, a sequential decoder that is used for decoding variable length code words that have been generated according to the code table of FIG. 1 comprises a shift register 53 that includes storage circuits 52,54,56,58,60, 62,64 and 66, and logic circuits 67 which contain no storage elements. No auxiliary state variables are required for decoding the code set forth in FIG. 1. However, in certain circumstances, a knowledge of word position in shift register 53 is required.

In FIG. 7, each storage circuit is shown as two flip-flops, (−1) and (−2), respectively. For decoding, a first clock signal 48 (generation not shown) is used, which runs at the rate of one cycle for each coded bit. Flip-flop 68 is a frequency divider driven by clock signal 48 to produce a second clock signal 49 which has a rate of one cycle for each decoded data bit. During successive cycles of clock 48, serial coded data from a storage medium (not shown) are applied to lead 50 at the input of shift register 53. During each positive phase of clock 48, the value of the coded bit on lead 50 is transferred to the first latch 52-1. Simultaneously with the entering of a coded bit into latch 52-1, the contents of latches 52-2, 54-2, 56-2, 58-2, 60-2, 62-2, and 64-2 are transferred to latches 54-1, 56-1, 58-1, 60-1, 62-1, 64-1 and 66-1, respectively. During the negative phase of clock 48, the coded bit values stored in latches with suffix 1 are set into the corresponding latches with suffix 2, thus completing a shift cycle.

The combinatorial logic circuit 67 is used to determine the values of decoded data bits from the contents of shift register 53. AND circuits 72, 74, and 76 and OR circuit 78 are used to generate a decoded data bit for each pair of coded bits entered. If the digits contained in latches 52-66 are h-a respectively, the output t of OR 78 is expressed by: $t = c + eh + bdf + af$. The outputs of OR circuit 78 and inverter 80 are valid whenever an even number of coded bits have been entered into shift register 53. Latch 70 is set to the value of the decoded bit at the appropriate times (clock 48 and clock 49 both positive).

With reference to FIG. 7, in decoding the code of FIG. 1, word endings in shift register 53 are recognized by the logic 67. A word ending is recognizable after any even number of encoded bits has been entered into the shift register. With reference to FIG. 7, the encoded pattern in the shift register at the end of a word is 0 0 0 1 or 0 0 1 0 in storage circuits 52,54,56,58 or 56,58,60,62 or 60,62,64,66.

In the particular example of the code of FIG. 1 and the decoding apparatus of FIG. 7, it is found that, for any code word, all 0,0 or 0,1 digit pairs in stages 56 and 58 of shift register 53 can be decoded without ambiguity by reference to other bits of the same word already present in shift register 53. Thus, the position of the word in the shift register does not need to be known in order to decode these digit pairs. The decoded data digit is provided by AND 72 or the normal output of latch 62 in all cases.

However, this is not true for all 1,0 digit pairs, specifically for the pattern 001000 when stored in stages 52 through 62 of register 53. In this case, the digits 10 (equivalent to 01 when read from left to right in FIG. 1) decode differently depending on whether a word boundary occurs between latches 62 and 64 (equivalent to the code word 000100 in latches 62-52 respectively). AND gates 74 and 76 produce a 1 output when the word boundary lies between latches 58 and 60 and a 0 output when the word boundary lies between latches 62 and 64. The outputs of these AND gates are fed to OR 78 so that the 01 code pair is decoded as 1 in the first boundary condition and 0 in the second boundary condition. An example of this decoding condition is found in the second and eighth decoded data digits produced by OR 78 in the example of FIG. 9, to be described.

Figure 9:
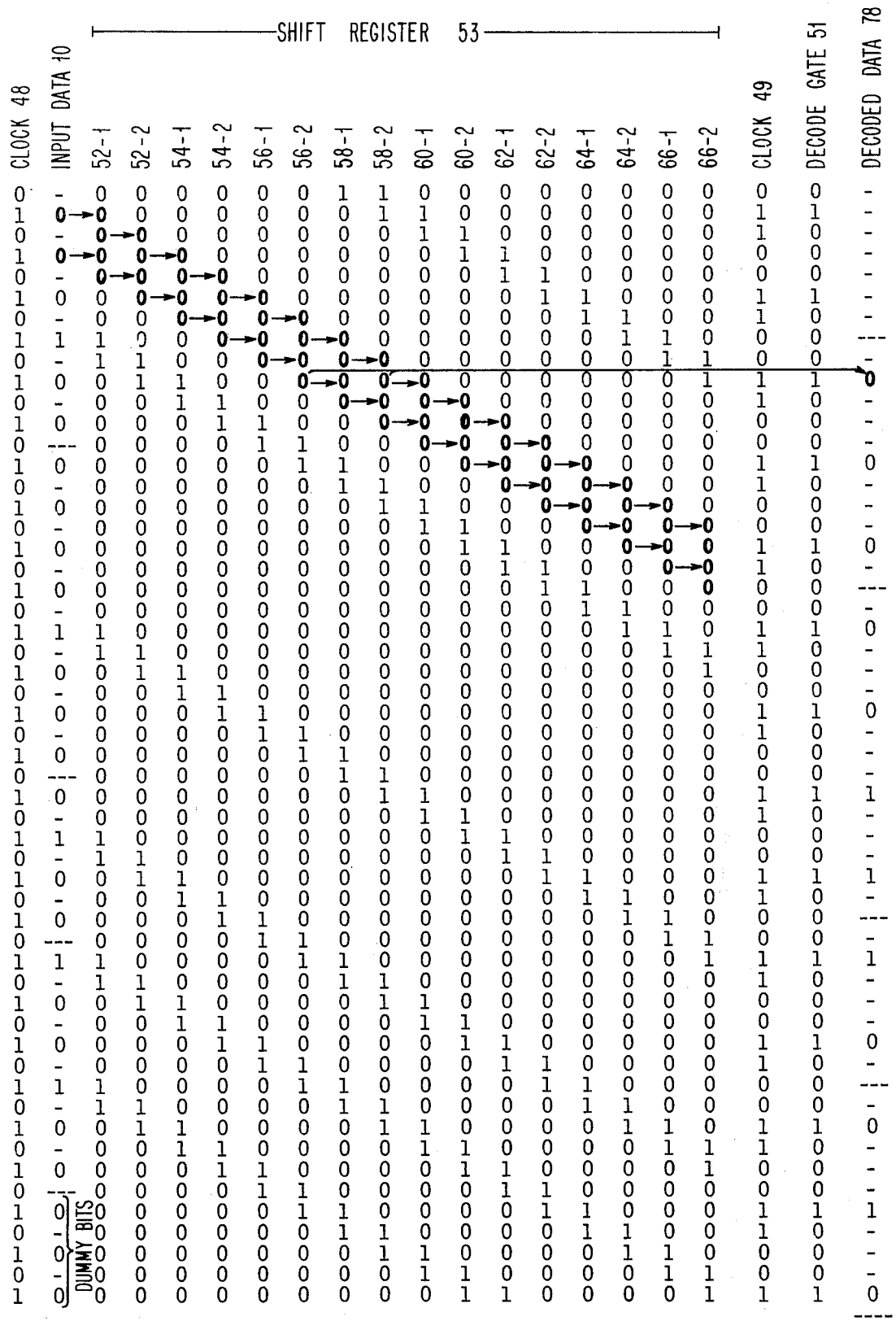
FIG. 9 is a tabular illustration of an example of decoding the data by the sequential decoder of FIG. 7 in accordance with this invention.

FIG. 9 illustrates a decoding example employing the sequential decoder of FIG. 7. One bit is decoded for each two coded bits entered into the shift register. The arrows from left to right show the progression of the first pair of coded bits from the input to the corresponding decoded data bit. The decoding sequence is as follows: Initially, storage circuits 52, 54, 56, and 58 are set to a word ending pattern (e.g., 0 0 0 1). Coded data is entered into shift register 53 in synchronism with clock 48. For the first four clock periods, the output of OR circuit 78 is ignored. After four coded bits have been entered into shift register 53, the output of OR circuit 78 is used to set decoded data bit values into latch 70, in synchronism with clock 49, one decoded bit for each two coded bits entered. The decoded data bit value in latch 70 corresponds to the pair of code digits currently stored in latches 56 and 58. Thus, coded data bits are decoded in a regular sequence two bits at a time by the apparatus of FIG. 7. Each pair of coded bits is decoded after a four code bit (two data bit) delay after it is shifted into latches 56 and 58. Following the entry of the last coded bit, three "dummy" bits are entered to complete the decoding process.

Variations of the preferred embodiment with respect to combinatorial encoding and decoding logic, number and arrangement of auxiliary state variables and arrangement and timing of shift registers are within the skill of the art.

The method described above can be used for encoding and/or decoding with any fixed-rate code by use of shift registers of suitable length, auxiliary state variables (where needed), and appropriate configurations of combinatorial logic circuits.

Auxiliary state variables need not be used if the definition of the code allows determination of the boundary between words by examination of a fixed number of input bits (data bits for encoder input; coded bits for decoder input), as for example in decoding the (d,k) = (2,7) and (d,k) = (1,8) codes described in the related U.S. Pat. No. 3,689,899.

The number of shift register stages, the number of auxiliary state variables, and the delay involved in encoding or decoding are dependent upon the specification of code words and the assignment of correspondences between data words and code words.

What is claimed is:

1. A method of decoding by electrical circuitry on a bit sequential basis a first string of run length limited binary bits representing variable length multi-bit code words into a second string of binary bits representing sequential multi-bit data words, said words belonging to a predefined dictionary, where said code words have twice as may bits as said data words, said method comprising:
    (1) generating by electrical circuitry a group of electrical signals representing the binary values of the bits in the first eight positions of said first string;
    (2) decoding by electrical circuitry the pair of bits in said 5th and 6th positions of said first string by logically combining in electrical circuitry all of said electrical signals from said group except one into a plurality of sub groups so that either said one electrical signal or the electric signal resulting from the sub group combination represents the value of the first bit of said second string one of said subgroups including a signal from said first position and another of said subgroups including a signal from said second position to thereby resolve the ambiguity between two four-bit patterns common to a pair of said code words in said predefined dictionary; and (3) repeating said first and second steps for the next new combination of eight sequential bit positions (3–10) beginning with the next sequential odd bit position (3) until said first string has been decoded.

2. A method of encoding by electrical circuitry on a bit by bit basis a first string of binary bits representing sequential data words of a variable word length code into a second run length limited string of binary bits representing sequential fixed rate code words of variable length, said method comprising the steps of:

(1) generating by electrical circuitry a plurality of electrical signals representing the binary values of the first three bit positions of said first string;

(2) generating by electrical circuitry an electrical control signal by logically combining in electrical circuitry a preselected group of said plurality of electrical signals, said electrical control signal providing an indication of the boundary between a first variable length data word and the next data word;

(3) generating by electrical circuitry an electrical signal representing the encoded value of the first bit position of said second string by logically combining in electrical circuitry said electrical control signal with a second preselected group of said plurality of electrical signals including the electrical signal corresponding to said first bit position of said first three bit positions of said first string;

(4) generating by electrical circuitry an electrical signal representing the value of the second bit position of said second string by logically combining in electrical circuitry said electrical control signal with a third preselected group of said plurality of electrical signals including the electrical signal representing the second bit position of said first three bit positions of said first string; and (5) repeating steps 1–4 for each succeeding new combination of three adjacent bit positions (2-3-4, 3-4-5, etc.) until the last bit position of said first string is encoded.

3. A method of encoding by electrical circuitry on a bit by bit basis a first string of binary bits representing a sequence of variable length data words predefined by a first dictionary containing data words whose lengths vary from 2 to 4 bit positions into a second string of binary bits representing a sequence of variable length code words, each bit of each data word of said first string being represented by two bits in said second string, said second string being a 2-7 run length limited sequence, said method comprising:

(1) generating by electrical circuitry a plurality of binary electrical signals corresponding to the true values and complemented values of the first three bit positions of said first string;

(2) generating by electrical circuitry an electrical control signal by combining in electrical circuitry selected ones of said plurality of binary signals in accordance with predefined logic to provide an indication of the presence of a word boundary between adjacent bit positions of said first three bit positions;

(3) logically combining in electrical circuitry the true and complement electrical signals corresponding to the value of said first bit position with selected ones of said true and complement electrical signals from said other two bit positions and said electrical control signal to generate an encoded electrical signal corresponding to the first encoded bit of said second string;

(4) logically combining in electrical circuitry said control signal with an electrical signal corresponding to the value of said second bit position to generate an encoded electrical signal corresponding to the second encoded bit of said second string; and (5) repeating steps 1–4 for the next new combination of three bit positions of said first string (2, 3 and 4) and each successive new combination of said first string until the last bit of said first string has been encoded.

4. A method of encoding by electrical circuitry on a bit sequential basis a first string of binary bits representing sequential multi-bit data words belonging to a predefined dictionary of data words, said data words having a minimum of two bits and a maximum of four bits, into a second string of binary bits representing sequential multi-bit code words corresponding to said sequential multi-bit data words in accordance with said predefined dictionary, each of said code words having twice as many bits as its corresponding data word, said method comprising:

(1) generating by electrical circuitry a group of electrical signals representing the binary values of the first three positions of said first string;

(2) generating by electrical circuitry a word ending electrical signal by logically combining in circuitry electrical signals selected from the first and second said positions of said group to indicate if the length of said first word is two bits, three bits or four bits in length;

(3) encoding by electrical circuitry the first bit of said first string into the first two bits of said second string when said indicator signal identifies a two bit data word by logically combining in electrical circuitry selected electrical signals from said group with said indicator electrical signal and encoding the second bit of said two bit word as two zeros, regardless of the value of said second bit; or (4) encoding by electrical circuitry the first bit of said first string into the first two bits of said second string when said indicating signal indicates a three bit data word by logically combining in electrical circuitry said three bit indicating electrical signal with the electrical signals from said group corresponding to the values of said first and third bits, and (5) encoding by electrical circuitry the second bit of said first string into the second two bits of said second string when said indicating electrical signal indicates a three bit data word by logically combining in electrical circuitry said three bit indicator electrical signal with selected electrical signals from said group corresponding to the values of said second and third positions and encoding by electrical circuitry the last bit of said data word into two zeros by logically combining in electrical circuitry the electrical signal from said group corresponding to the value of said third position with said three bit indicating signal; or (6) encoding by electrical circuitry the first bit of said first string into two zeros of said second string when said indicating electrical signal indicates a four bit data word by combining in electrical circuitry said four bit word indicating electrical signal with an electrical signal from said group corresponding to the value of said first bit position;

(7) generating by electrical circuitry a second group of electrical signals representing the values of the next new combination of three bit positions (2, 3 and 4) of said first string;

(8) generating by electrical circuitry a second indicator electrical signal from said second group of electrical signals to indicate the length of code words;

(9) encoding by electrical circuitry the second bit of said first four bit word into the second two bits of said second string by logically combining in electrical circuitry said second indicator electrical signal and electrical signals from said second group corresponding to the values of said second and fourth positions of said string;

(10) encoding by electrical circuitry the third bit of said first four bit word into the third two bits of said second string by logically combining in electrical circuitry said second indicator electrical signal and the electrical signals from said second group corresponding to the values of said third and fourth positions of said string;

(11) encoding by electrical circuitry the last bit of said first four bit word into two zeros to form the last two bits of said first code word by logically combining in electrical circuitry a signal from said second group corresponding to the value of said fourth position with said second indicator electrical signal; and

(12) repeating the above steps for each successive data word in said first string.

5. Apparatus for converting bit signals representative of binary data in one form to bit signals representative of the same data in another form according to a run-length-limited variable word length code wherein one of said forms is a coded form in which only a predetermined plurality of bit signal patterns of differing lengths are valid code words, said code also being of fixed rate so that each of said code words in said coded form corresponds to a respective predetermined word of directly proportional length in said other form;

said apparatus comprising:

input shift register means arranged to receive input bit signals in one of said forms serially at an input signal rate and having a plurality of stages for storing said input bit signals;

clocking means for providing clock signals in synchronism with said input bit signals and being connected to said input shift register means to shift said input bit signals progressively therethrough at said input signal rate;

word position storage means for storing information indicating the position of a word boundary relative to said input shift register means;

updating means responsive to said input shift register means and said word position storage means for updating said word position storage means as said input bit signals are shifted through said input shift register means;

conversion logic means, connected to said input shift register means and said word position storage means, for converting a fixed number of bit signals in one of said forms, stored in a predetermined portion of said input shift register means, into a corresponding number of output bit signals in the other of said forms according to said variable word length code, said fixed number of bit signals being less than the number of bit signals in the longest input bit signal variable length word; and output gating means responsive to said clock signals to gate said output bit signals successively to an output at an output signal rate related to said input signal rate by said fixed rate of said code.

6. Apparatus according to claim 5 wherein said word position storage means is a shift register, comprising a plurality of stages, and wherein said updating means comprises:

updating logic means for generating a word boundary indicating bit signal when the last bit signal of a word is in a predetermined stage of said input shift register means, and means for setting an input stage of said word position storage shift register with said word boundary indicating bit signal;

said clocking means also being connected to said word position storage shift register to shift said boundary indicating bit signal through said word position storage shift register in step with the shifting of input bit signals through said input shift register means.

7. Apparatus for encoding input data bit signals according to a run-length-limited variable word length code in which only a predetermined plurality of encoded bit signal patterns of differing lengths are valid code words, said code also being of fixed rate so that each of said code words corresponds to a respective predetermined word of directly proportional length in said input bit signals;

said apparatus comprising:

input shift register means arranged to receive input bit signals serially at an input signal rate and having a plurality of stages for storing said input bit signals;

clocking means for providing clock signals in synchronism with said input bit signals and being connected to said input shift register means to shift said input bit signals progressively therethrough at said input signal rate;

word position storage means for storing information indicating the position of a word boundary relative to said input shift register means;

updating means responsive to said input shift register means and said word position storage means for updating said word position storage means as said input bit signals are shifted through said input shift register means;

encoding logic means, connected to said input shift register means and said word position storage means, for encoding a fixed number of bit signals, stored in a predetermined portion of said input shift register means, into a corresponding number of output bit signals according to said variable word length code, said fixed number of bit signals being less than the number of bit signals in the longest input bit signal variable length word; and output gating means responsive to said clock signals to gate said encoded output bit signals successively to an output at an output signal rate related to said input signal rate by said fixed rate of said code.

8. Apparatus according to claim 7 wherein said word position storage means is a shift register, comprising a plurality of stages, and wherein said updating means comprises:
- updating logic means for generating a word boundary indicating bit signal when the last bit signal of a word is in a predetermined stage of said input shift register means, and means for setting a predetermined stage of said word position storage shift register with said word boundary indicating bit signal;
- said clocking means also being connected to said word position storage shift register to shift said boundary indicating bit signal through said word position storage shift register in step with the shifting of input bit signals through said input shift register means.

9. Apparatus according to claim 7 wherein said predetermined portion of said input shift register is a single stage, wherein each input bit signal is encoded as a pair of output bit signals and wherein each stage of said input shift register means comprises a pair of latches, designated odd and even;
- said clocking means providing odd and even phase clock signals alternately to said odd and even latches to shift input bit signals progressively therethrough;
- said encoding logic means comprising means responsive to said odd latches and to said word position storage means to generate one of said output bit signals of an encoded pair and means responsive to said even latches and to said word position storage means to generate said other output bit signal of an encoded pair; and
- said output gating means comprising means responsive to clock signals of one phase to gate the first of each said pair of output bit signals to said output and means responsive to clock signals of said other phase to gate the second of each said pair of output bit signals to said output.

10. Apparatus according to claim 8 wherein each binary input signal is encoded as a pair of associated output bit signals, designated $t_o$ and $t_l$, according to a (2,7) run length limited variable word length code,
- wherein said input shift register means comprises three stages, designated $a$, $b$, and $c$, and said clocking means is connected to shift said input bit signals progressively from stage $c$ through stage $a$;
- wherein said word position storage shift register comprises said predetermined stage, designated r, and an immediately following stage, designated q;
- wherein said word boundary indicating signal is designated $p$ and is generated by said updating logic means according to the logical function $a\,b\,c\,q\,r + a\,b + a\,b\,r$;
- and wherein said encoding logic means generates a first output bit signal $t_o$ according to the logical function $a\,b\,c\,q + a\,b\,q$ and generates a second output bit signal $t_l$ according to the logical function $b\,r$, said output bit signals $t_o$ and $t_l$ corresponding to the input bit signal currently in stage $a$ of said input shift register means.

11. Apparatus for decoding sequentially a plurality of pairs of associated bit signals coded in a (2,7) run length limited variable word length code, each of said pairs of coded bit signals corresponding to one decoded bit signal, and said code being such that valid code words terminate in a word ending sequence of at least four bit signals which is distinct from any other two adjacent associated pairs of coded bit signals;

said apparatus comprising:
- coded bit signal shift register means having at least eight stages, designated $a$ through $h$, sufficient to store said word ending sequence in a plurality of said stages, comprising stages $d$ through $a$, which follow stages $e$ and $f$, and being arranged to receive said coded bit signals at a coded bit signal rate;
- clocking means for providing clock signals in synchronism with said coded bit signals and being connected to said coded bit signal shift register means to shift said coded bit signals progressively therethrough at said coded bit signal rate in a direction from stage $h$ to stage $a$; and
- decoding logic means responsive to the contents of predetermined stages of said coded bit signal shift register means to generate a decoded bit signal corresponding to the coded bit signals stored in stages $e$ and $f$ of said shift register means;

said decoding logic means comprising:
- first logic circuit means connected to a first group of predetermined stages of said shift register means and responsive to at least the presence of said distinct word ending sequence in said plurality of stages, comprising stages $d$ through $a$, to provide at least a first output signal;
- second logic circuit means connected to a second group of predetermined stages of said shift register means and responsive to other predetermined conditions of said shift register means to produce at least a second output signal; and
- third logic circuit means for logically combining at least said first and second output signals to produce said decoded bit signal;
- said apparatus further comprising output gating means responsive to said clock signals to gate successive decoded bit signals to an output at a decoded bit signal rate which is half said coded bit signal rate.

12. Apparatus according to claim 11 wherein said first logic circuit means is connected to at least stages $a$, $b$ and stage $f$ of said shift register means.

13. Apparatus according to claim 11 wherein said second logic circuit means is connected to at least stages $c$, $e$ and $h$ of said shift register means.

14. Apparatus according to claim 13 wherein said first logic circuit means is arranged to generate two output signals according to the logical expressions $a\,f$ and $b\,d\,f$, wherein said second logic circuit means is arranged to generate two output signals according to the logical expressions $c$ and $e\,h$ and wherein said third logic circuit means comprises an OR gate for generating a decoded bit signal according to the logical function $c + e\,h + b\,d\,f + a\,f$.

* * * * *